(12) United States Patent
Hishinuma et al.

(10) Patent No.: US 12,328,813 B2
(45) Date of Patent: Jun. 10, 2025

(54) ELECTRONIC DEVICE

(71) Applicant: Japan Display Inc., Tokyo (JP)

(72) Inventors: Masatomo Hishinuma, Tokyo (JP); Hiroumi Kinjo, Tokyo (JP)

(73) Assignee: Japan Display Inc., Tokyo (JP)

( * ) Notice: Subject to any disclaimer, the term of this patent is extended or adjusted under 35 U.S.C. 154(b) by 260 days.

(21) Appl. No.: 18/131,018

(22) Filed: Apr. 5, 2023

(65) Prior Publication Data

US 2023/0328880 A1    Oct. 12, 2023

(30) Foreign Application Priority Data

Apr. 6, 2022 (JP) ................. 2022-063345

(51) Int. Cl.
*H05K 1/02* (2006.01)

(52) U.S. Cl.
CPC . *H05K 1/0296* (2013.01); *H05K 2201/09263* (2013.01); *H05K 2201/10151* (2013.01)

(58) Field of Classification Search
CPC .................................................. H05K 1/0296
See application file for complete search history.

(56) References Cited

U.S. PATENT DOCUMENTS

2023/0041550 A1    2/2023    Katsuhara et al.

FOREIGN PATENT DOCUMENTS

WO    2021/140967 A1    7/2021

*Primary Examiner* — Jeremy C Norris
(74) *Attorney, Agent, or Firm* — K&L Gates LLP

(57) ABSTRACT

According to one embodiment, an electronic device includes a first substrate and a second substrate. The first substrate includes a first insulating base, a wiring layer and a sensor electrode. The first insulating base is made into a mesh-like form. The wiring layer is disposed over a first band portion of the first insulating base. The sensor electrode is disposed over a first island-shaped portion of the first insulating base. The second substrate includes a second insulating base, a common electrode and a sensor sheet. The second insulating base is made into a mesh-like form. The common electrode is made into a mesh-like form. The sensor sheet overlaps a second island-shaped portion of the second insulating base in plan view and is disposed below the common electrode.

12 Claims, 14 Drawing Sheets

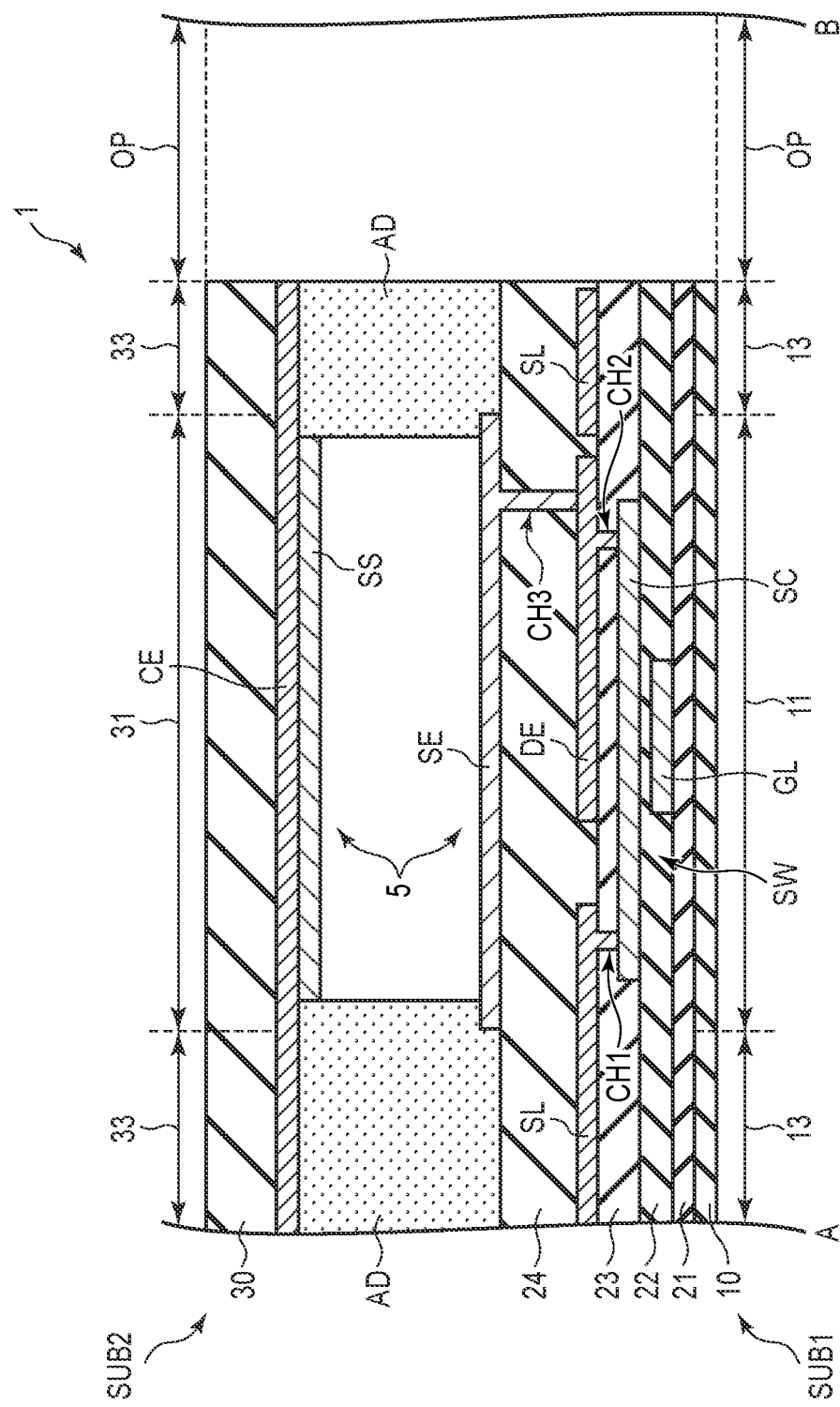
F I G. 4

F.I.G. 10

ELECTRONIC DEVICE

CROSS-REFERENCE TO RELATED APPLICATIONS

This application is based upon and claims the benefit of priority from Japanese Patent Application No. 2022-063345, filed Apr. 6, 2022, the entire contents of which are incorporated herein by reference.

FIELD

Embodiments described herein relate generally to an electronic device.

BACKGROUND

In recent years, the use of flexible substrates with flexibility and elasticity has been considered in various fields. For example, it is being considered to attach a flexible substrate on which sensor elements are arrayed in a matrix to curved surface such as a housing of an electronic device or the human body, etc.

However, in sensing by sensor elements mounted on such the flexible substrate, errors may occur before and after the flexible substrate expands or contracts.

BRIEF DESCRIPTION OF THE DRAWINGS

FIG. 4 is a cross-sectional view of an electronic device cut along line A-B of FIGS. 2 and 3.

DETAILED DESCRIPTION

Figure 1:
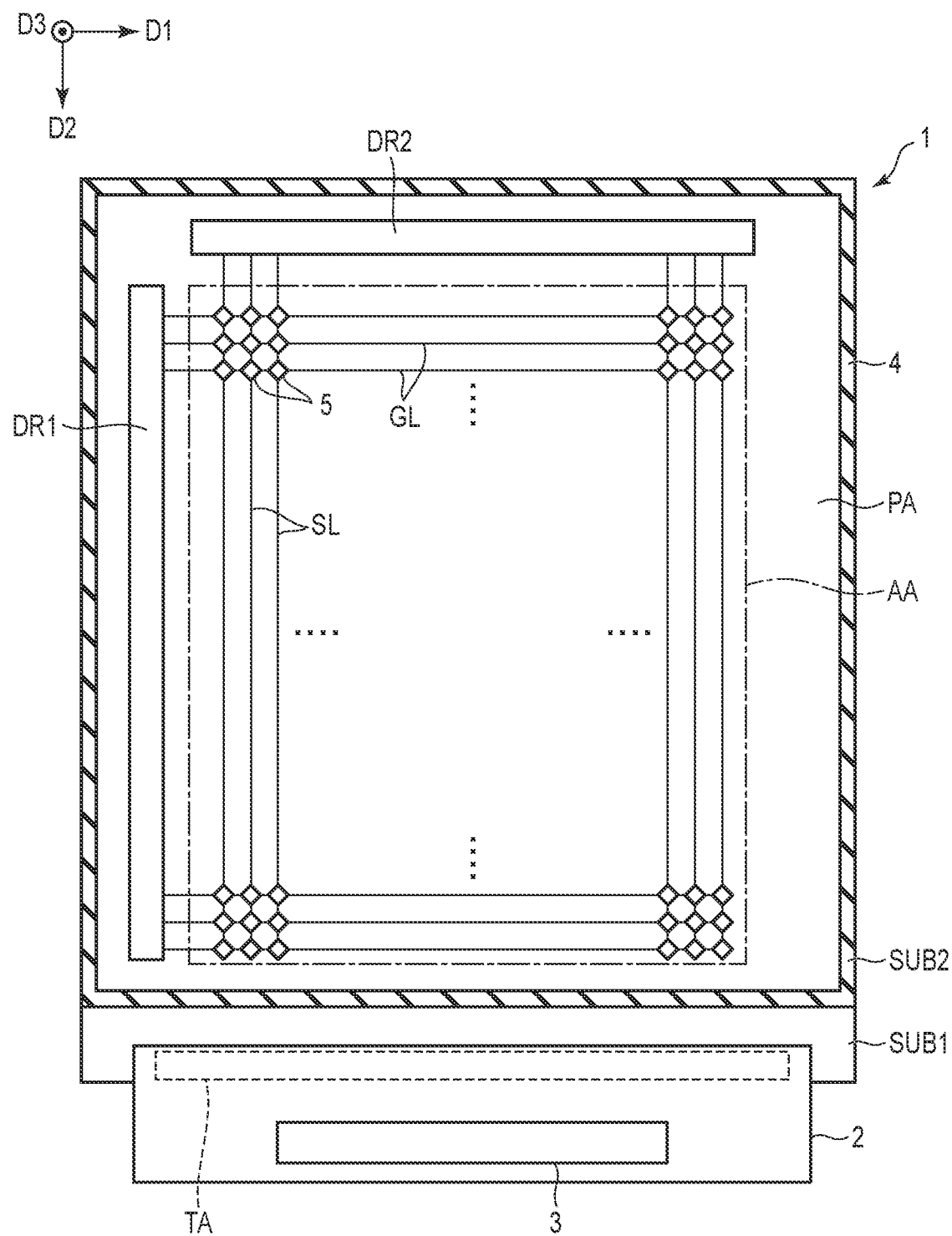
FIG. 1 is a plan view schematically showing an electronic device according to the first embodiment.

In general, according to one embodiment, an electronic device includes a first substrate and a second substrate opposing the first substrate. The first substrate includes a first insulating base, a wiring layer and a sensor electrode. The first insulating base includes a plurality of first island-shaped portions and a plurality of first band portions each connecting a respective pair of first island-shaped portions adjacent to each other, and is made into a mesh-like form. The wiring layer is disposed over the first band portion. The sensor electrode is disposed over the first island-shaped portion and electrically connected to the wiring layer. The second substrate includes a second insulating base, a common electrode and a sensor sheet. The second insulating base includes a plurality of second island-shaped portions and a plurality of second band portions connecting a respective pair of second island-shaped portions adjacent to each other, and is made into a mesh-like form. The common electrode is disposed below the second island-shaped portion and the second band portion, and made into a mesh-like form. The sensor sheet overlaps the second island-shaped portion in plan view and is disposed below the common electrode.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

FIG. 1 is a plan view schematically showing an electronic device 1 of the first embodiment. In this embodiment, a first direction D1, a second direction D2 and a third direction D3 are defined as shown in the figure. The first direction D1 and the second direction D2 are parallel to a main surface of the electronic device 1 and intersect each other. The third direction D3 is perpendicular to the first and second directions D1 and D2, and corresponds to a thickness direction of the electronic device 1. The first direction D1 and the second direction D2 intersect perpendicularly in this embodiment, but may intersect at an angle other than perpendicularly. In this specification, the direction toward a tip of an arrow indicating the third direction D3 is referred to as "up" and the direction from the tip of the arrow to an opposite direction is referred to as "down". It is assumed that there is an observation position to observe the electronic device 1 on the tip side of the arrow indicating the third direction D3, and viewing the D1-D2 plane defined by the first direction D1 and the second direction D2 from this observation position is called a plan view.

The electronic device 1 is a pressure sensor and, as shown in FIG. 1, comprises a first substrate SUB1, a second substrate SUB2, a circuit board 2 and a controller 3. For example, the circuit board 2 is a flexible printed circuit board. The circuit board 2 is electrically connected to each terminal in a terminal area TA of the first substrate SUB1. The controller 3 is mounted on the circuit board 2, but may as well be mounted on the first substrate SUB1. The first substrate SUB1 and the second substrate SUB2 are adhered together by an outer circumferential seal 4. The first substrate SUB1 and the second substrate SUB2 are flexible and elastic.

As shown in FIG. 1, the electronic device 1 includes an active area AA and a frame-like peripheral area PA surrounding the active area AA. The active area AA is an area where sensor elements, which will be described later, are disposed and may be referred to as a sensing area. The peripheral area PA is an area where peripheral circuits such as various types of drivers and the like, which will be described later, are disposed.

As shown in FIG. 1, the electronic device 1 further comprises a plurality of scanning lines GL, a plurality of signal lines SL, a plurality of sensor elements 5, a scanning line driver DR1, a signal line driver DR2 and the like. The scanning lines GL, the signal lines SL and the sensor elements 5 are arranged in the active area AA. The scanning line driver DR1 and the signal line driver DR2 are arranged in the peripheral area PA. The scanning lines GL each extend along the first direction D1 and are aligned along the second direction D2. The scanning lines GL are each connected to the scanning line driver DR1. The signal lines SL each extend along the second direction D2 and are aligned along the first direction D1. The signal lines SL are each connected to the signal line driver DR2. The sensor elements 5 are each located at the respective intersection of a respective scanning line GL and a respective signal line SL, and are electrically connected to the scanning line GL and the signal line SL, respectively. Specific configuration examples of the sensor elements 5 will be provided later.

Figure 2:
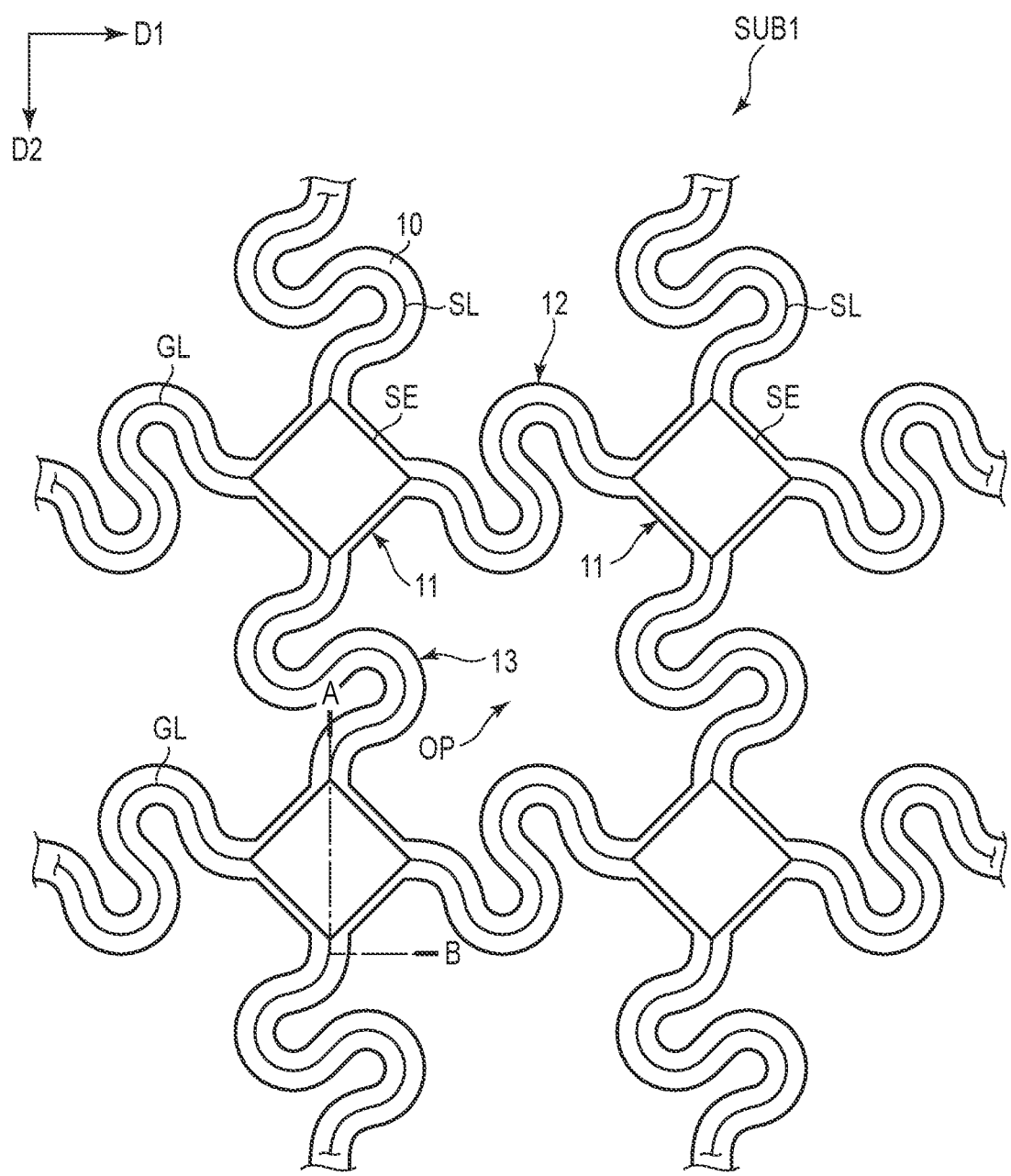
FIG. 2 is an enlarged plan view of a part of a first substrate shown in FIG. 1.

FIG. 2 is an enlarged plan view of a part of the first substrate SUB1 (the active area AA) shown in FIG. 1. The first substrate SUB1 comprises an insulating base 10 (a first insulating base) that supports the scanning lines GL and the signal lines SL, and sensor electrodes SE that constitute the sensor elements 5, respectively.

The insulating base 10 comprises a plurality of body portions 11 (first island-shaped portions) and hinge portions 12 and 13 (first band-shaped portions) formed to be integrated with the body portions 11, respectively, and is formed in a mesh-like form with openings OP. The insulating base 10 is flexible and can be formed of polyimide, for example, but the material is not limited to that of this example.

The body portions 11 are arranged in a matrix so as to be spaced apart from each other along the first direction D1 and the second direction D2. Each of the body portions 11 is formed into a quadrangular (rhombic) shape, for example, in plan view. Note that the body portions 11 may be formed into some other polygonal shape or circular or elliptical shape.

The hinge portions 12 extend substantially along the first direction D1 and are aligned along the second direction D2. The hinge portions 12 each connect a plurality of body portions 11 aligned along the first direction D1. The hinge portions 13 each extend substantially along the second direction D2 and are aligned along the first direction D1. The hinge portions 13 each connect a plurality of body portions 11 aligned along the second direction D2. The hinge portions 12 and 13 are each formed into a wavy (meander) shape in plan view.

The scanning lines GL extend while overlapping the respective hinge portions 12. The signal lines SL extend while overlapping the respective hinge portions 13. That is, both the scanning lines GL and the signal lines SL are all formed into a wavy (meander) shape.

The scanning lines GL and the signal lines SL are electrically connected to the respective sensor electrodes SE via contact holes, which will be described later.

Figure 3:
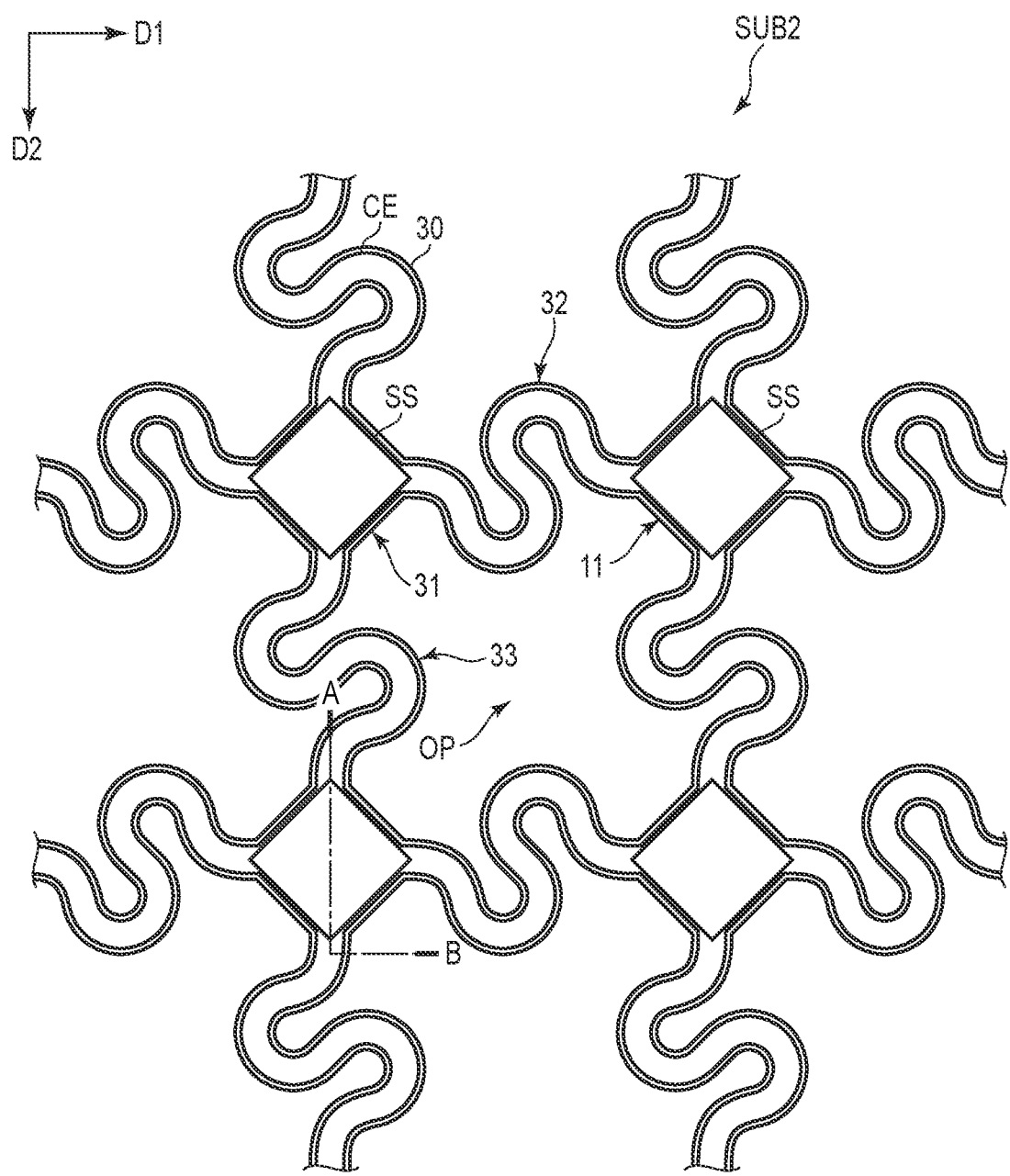
FIG. 3 is an enlarged plan view of a part of a second substrate shown in FIG. 1.

FIG. 3 is an enlarged plan view of a part of the second substrate SUB2 (active area AA) shown in FIG. 1. The second substrate SUB2 comprises a common electrode CE and sensor sheets SS that constitute the sensor elements 5, and an insulating base 30 (second insulating base) supporting the common electrode CE and the sensor sheets SS.

The insulating base 30 comprises a plurality of body portions 31 (second island-shaped portions) and hinge portions 32 and 33 (second band-shaped portions) formed to be integrated with the respective body portions 31, and is formed in a mesh-like form with openings OP. The insulating base 30 is flexible and can be formed of, for example, polyimide, polyethylene terephthalate, polydimethylsiloxane or the like, but not limited to these.

The body portions 31 are arranged to be spaced apart from each other in a matrix along the first direction D1 and the second direction D2. Each of the body portions 31 is formed into a quadrangular (rhombic) shape, for example, in plan view. The body portions 31 may be formed in some other polygonal shape or circular or elliptical shape.

The hinge portions 32 extend substantially along the first direction D1 and are aligned along the second direction D2. The hinge portions 32 each connect a plurality of body portions 31 aligned along the first direction D1. The hinge portions 33 extends substantially along the second direction D2 and are aligned along the first direction D1. The hinge portions 33 each connect a plurality of body portions 31 aligned along the second direction D2. The hinge portions 32 and 33 are each formed into a wavy (meander) shape in plan view.

The body portions 31 have a shape similar to that of the body portions 11 of the insulating base 10 and overlap the body portions 11 respectively in plan view. The hinge portions 32 have a shape similar to that of the hinge portions 12 of the insulating base 10 and overlap the hinge portions 12 respectively in plan view. The hinge portions 33 have a shape similar to that of the hinge portions 13 of the insulating base 10 and overlap the hinge portions 13 respectively in plan view.

The common electrode CE extends while overlapping the body portion 31 and the hinge portions 32 and 33. That is, the common electrode CE, as in the case of the insulating base 30 described above, is made into a mesh-like form including the openings OP. The sensor sheets SS each overlap the respective body portion 31.

FIG. 4 is a cross-sectional view of the electronic device 1 cut along line A-B of FIGS. 2 and 3. Here, the configuration of the sensor elements 5 will be mainly described.

As shown in FIG. 4, the sensor elements 5 each comprises a switching element SW, the sensor electrode SE, the sensor sheet SS, the common electrode CE and the like.

First, the configuration on the first substrate SUB1 side will be described. On the insulating base 10, an insulating layer 21 is disposed. The insulating base 10 has a film thickness of, for example, 10 μm. On the insulating layer 21, the scanning line GL, which functions as a gate electrode of the switching element SW, is disposed.

On the insulating layer 21, an insulating layer 22 is disposed. The insulating layer 22 covers the scanning line GL. On the insulating layer 22, a semiconductor layer SC, which constitutes the switching element SW, is disposed. The semiconductor layer SC is formed of, for example, polycrystalline silicon (for example, low-temperature polysilicon), but may as well be formed of amorphous silicon or oxide semiconductor. On the insulating layer 22, an insulating layer 23 is disposed. The insulating layer 23 covers the semiconductor layer SC. On the insulating layer 23, the signal line SL, which functions as a source electrode of the switching element SW, and a drain electrode DE of the switching element SW are disposed. The signal line SL is connected to the semiconductor layer SC via a contact hole CH1 formed in the insulating layer 23. The signal line SL can be formed of, for example, a metal material or a transparent conductive material, and may have a single-layer structure or a stacked layer structure. The drain electrode DE is connected to the semiconductor layer SC via a contact hole CH2 formed in the insulating layer 23. The drain electrode DE is formed of the same material as that of the signal line SL, for example. The drain electrode DE respectively overlap the scanning line GL in plan view. On the insulating layer 23, an insulating layer 24 is disposed. The insulating layer 24 covers the signal line SL and the drain electrode DE.

On the insulating layer 24, a sensor electrode SE is disposed. The sensor electrode SE is connected to the drain electrode DE via a contact hole CH3 formed in the insulating layer 24. The sensor electrode SE is a transparent electrode formed of a transparent conductive material such as indium tin oxide (ITO) or indium zinc oxide (IZO). The sensor electrode SE is disposed at a position overlapping the body portion 11 and is not disposed at positions overlapping the hinge portions 13 (and the hinge portions 12, which is not shown in FIG. 4) or in the opening OP.

The switching element SW is located between the body portion 11 of the insulating base 10 and the sensor electrode SE. The switching element SW shown in FIG. 4 has a single-gate structure, but it may as well be of a double-gate structure. The switching element SW shown in FIG. 4 has a bottom-gate structure in which the gate electrode (scanning line GL) is disposed under the semiconductor layer SC, but it may as well be of a top-gate structure in which the gate electrode (scanning line GL) is disposed on the semiconductor layer SC.

The insulating layers 21 to 23 are inorganic insulating layers each formed of an inorganic insulating material such as silicon oxide (SiO), silicon nitride (SiN) or silicon oxynitride (SiON). The insulating layer 24 is an organic insulating layer formed of an organic insulating material such as acrylic resin. The upper surface of the insulating layer 24 is substantially planarized.

Next, the configuration on the second substrate SUB2 side will be described. Under the insulating base 30, the common electrode CE is disposed. The insulating base 30 has a film thickness of, for example, 50 μm. The common electrode CE is disposed at a position overlapping the body portion 31 and at positions overlapping the hinge portions 33 (and the hinge portions 32, which are not shown in FIG. 4) and is not disposed in the opening OP. The common electrode CE is formed of an organic-based conductive material.

The sensor sheet SS is disposed below the common electrode CE so as to oppose the sensor electrode SE. The sensor sheet SS is disposed in a position overlapping the body portion 31 and is not disposed at positions overlapping the hinge portions 33 (and the hinge portions 32, which are not shown in FIG. 4) or in the opening OP.

The sensor electrode SE and the sensor sheet SS are bonded together by the adhesive layer AD. In another expression, the elements on the first substrate SUB1 side and the elements on the second substrate SUB2 side, which constitute the sensor element 5, are bonded together by the adhesive layer AD. The adhesive layer AD is disposed between the insulating layer 24 and the common electrode CE. Between the sensor electrode SE and the sensor sheet SS, a space is provided. With this configuration, when pressure is applied from the second substrate SUB2 side, the sensor sheet SS is brought into contact with the sensor electrode SE. The electronic device 1 detects a change in contact resistance caused by the sensor sheet SS being brought into contact with the sensor electrode SE and measures the pressure applied to the electronic device 1 based on the change in contact resistance.

FIGS. 5 to 8 are cross-sectional views showing an example of the formation process of the sensor element 5 shown in FIG. 4 in sequential steps.

Figure 5:
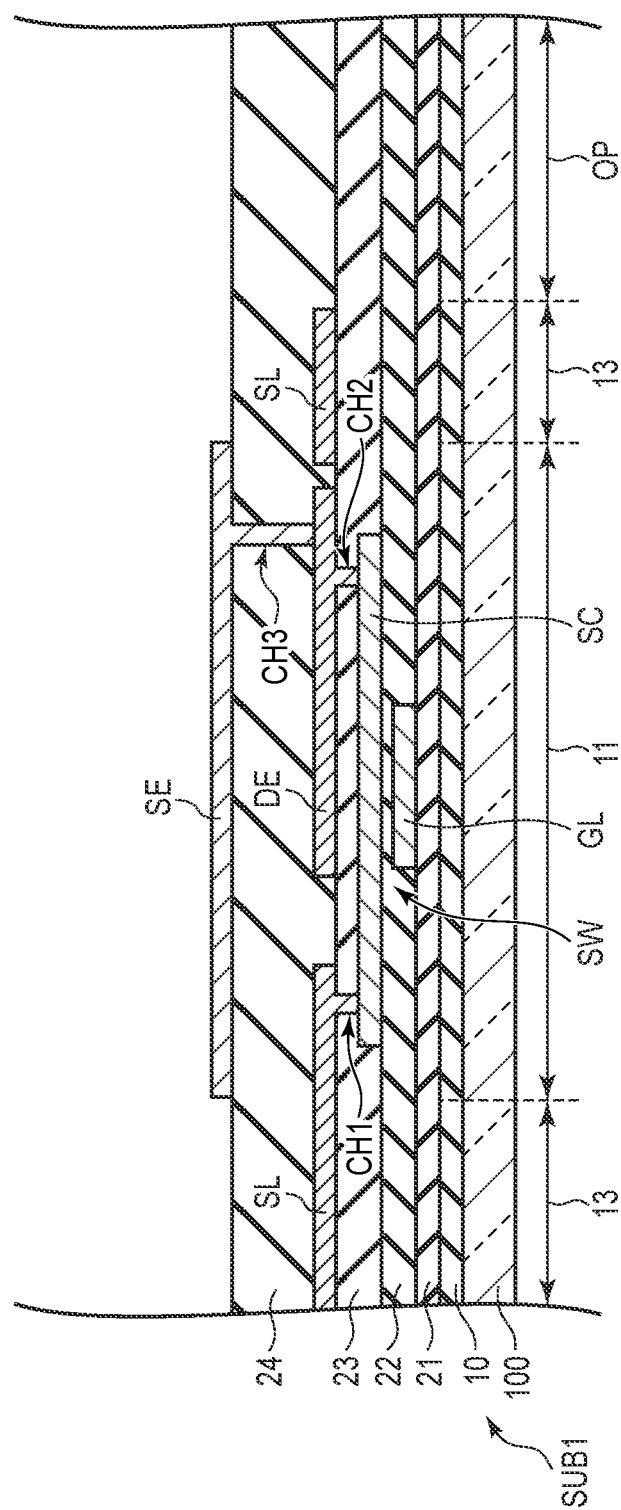
FIG. 5 is a cross-sectional view showing an example of the formation process of the electronic device shown in FIG. 4.

First, the configuration on the first substrate SUB1 side is formed. More specifically, as shown in FIG. 5, the insulating base 10 is formed over the entire surface of the glass substrate 100. On the insulating base 10, the insulating layer 21 is formed. On the insulating layer 21, the scanning line GL is formed. The scanning line GL is formed at a position where the body portion 11 and the hinge portions 12, which are not illustrated in FIG. 5, are formed.

On the insulating layer 21, the insulating layer 22 is formed to cover the scanning line GL. On the insulating layer 22, the semiconductor layer SC is formed. The semiconductor layer SC is formed at a position where the body portion 11 is formed. On the insulating layer 22, the insulating layer 23 is formed so as to cover the semiconductor layer SC. Two contact holes CH1 and CH2 are formed at respective positions where the insulating layer 23 and the semiconductor layer SC overlap each other in plan view. On the insulating layer 23, the signal line SL and the drain electrode DE are formed. The signal line SL is formed at a position where the body portion 11 and the hinge portions 13 are formed, and is connected to the semiconductor layer SC via the respective contact hole CH1. The drain electrode DE is formed at a position where the body portion 11 is formed and is connected to the semiconductor layer SC via the contact hole CH2.

On the insulating layer 23, the insulating layer 24 is formed so as to cover the signal line SL and the drain electrode DE. The contact hole CH3 is formed at a position where the insulating layer 24 and the respective drain electrode DE overlap in plan view. The sensor electrode SE is formed on the insulating layer 24. The sensor electrode SE is formed at a position where the body portion 11 is formed, and is connected to the drain electrode DE via the contact hole CH3.

Figure 6:
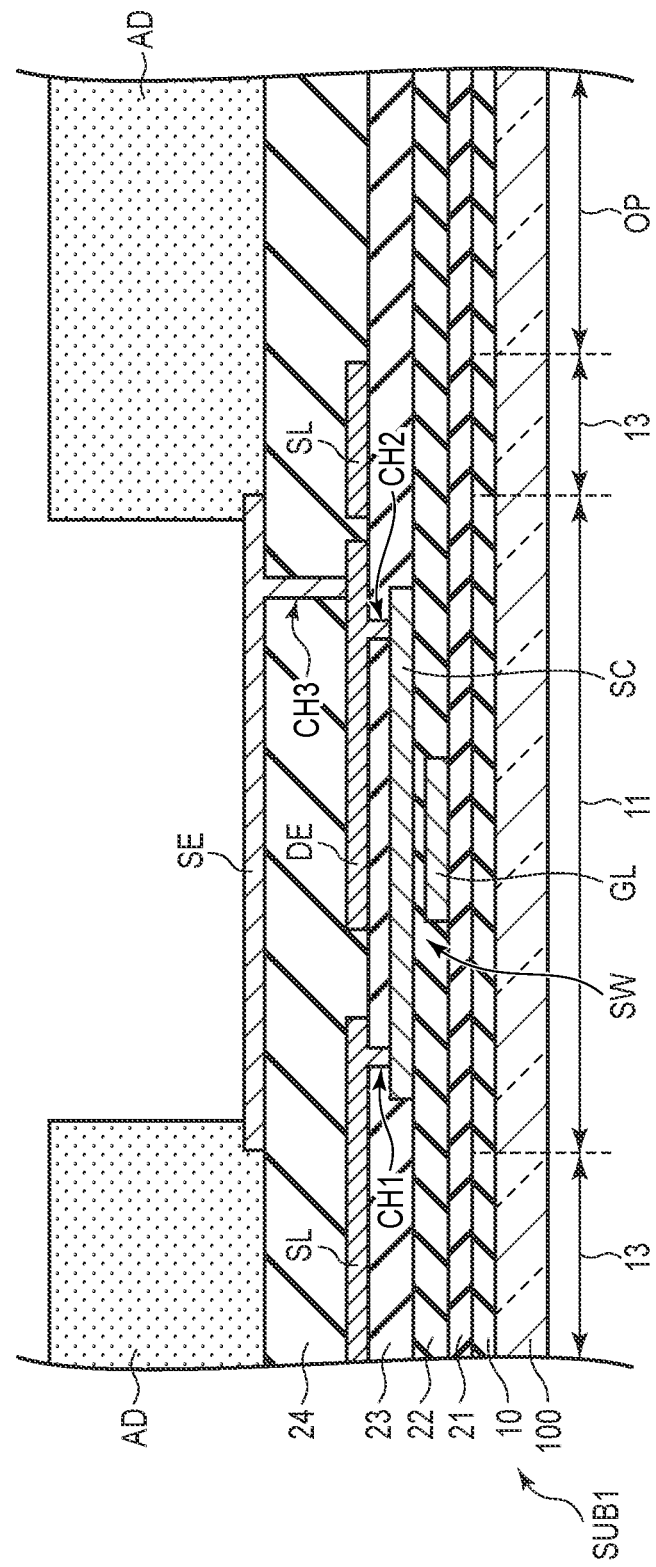
FIG. 6 is a cross-sectional view showing an example of the formation process of the electronic device shown in FIG. 4.

Subsequently, as shown in FIG. 6, an adhesive layer AD is provided over the insulating layer 24. In another expression, the adhesive layer AD is provided at a position other than where the body portion 11 is formed. Note here, as shown in FIG. 6, the adhesive layer AD covers end portions of the sensor electrode SE and is provided at a position overlapping the outer circumference of the body portion 11.

Although the illustration thereof is omitted here, the configuration of the second substrate SUB2 side is formed separately from the configuration of the first substrate SUB1 side. More specifically, the common electrode CE is formed on the insulating base 30. The sensor sheet SS is provided on the common electrode CE. The sensor sheet SS is provided at a position where the body portion 31 is formed. By the above-described processing steps, the configuration of the second substrate SUB2 side is formed.

Figure 7:
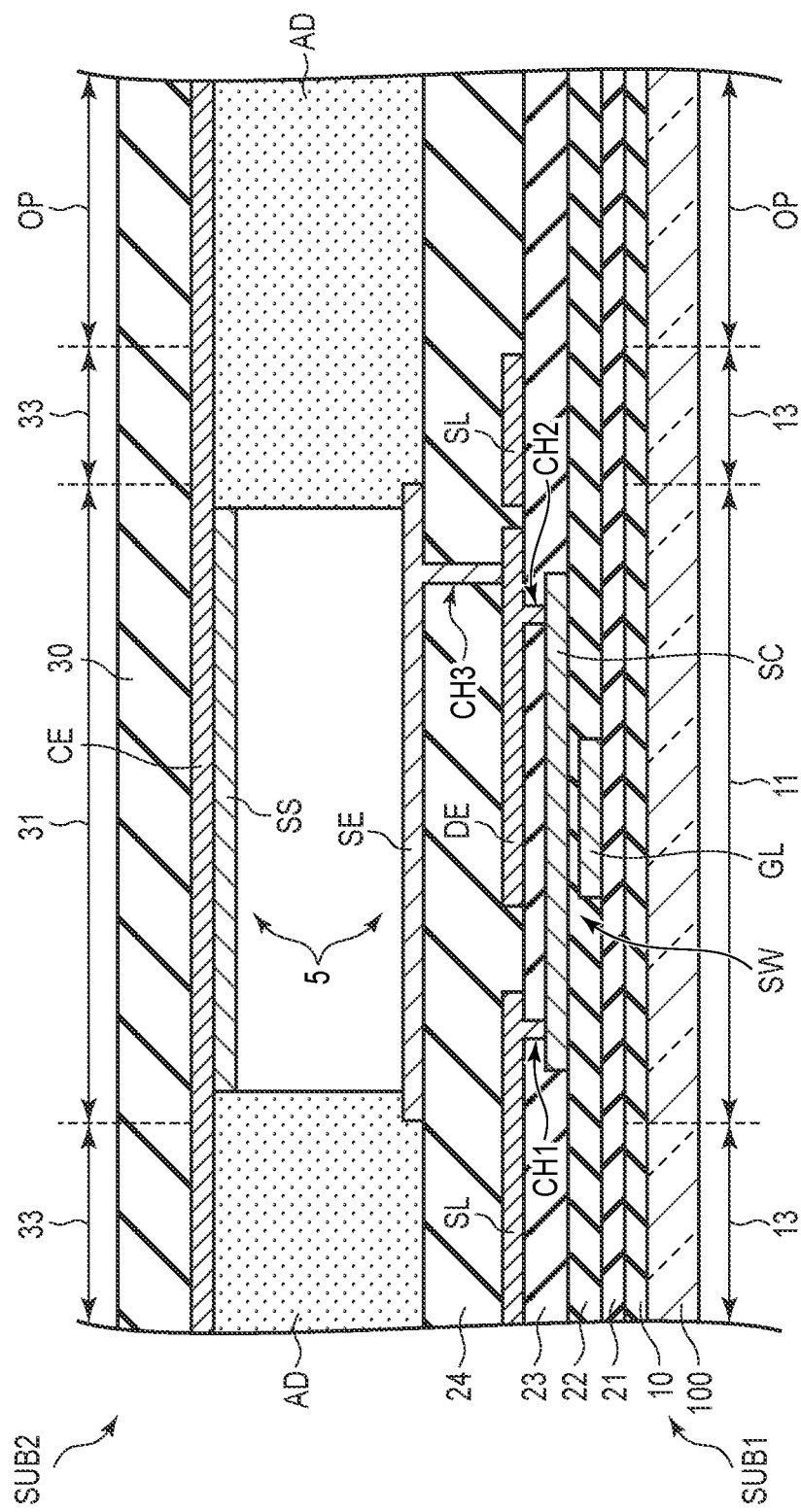
FIG. 7 is a cross-sectional view showing an example of the formation process of the electronic device shown in FIG. 4.

Next, as shown in FIG. 7, the configuration of the first substrate SUB1 side and the configuration of the second substrate SUB2 side are bonded together. In this manner, as shown in FIG. 7, the sensor electrode SE and the sensor sheet SS are bonded together by the adhesive layer AD, and at a position where the body portion 11 (the body portion 31) is formed, the sensor element 5 can be formed in such a state that the sensor electrode SE and the sensor sheet SS oppose each other via the space.

Figure 8:
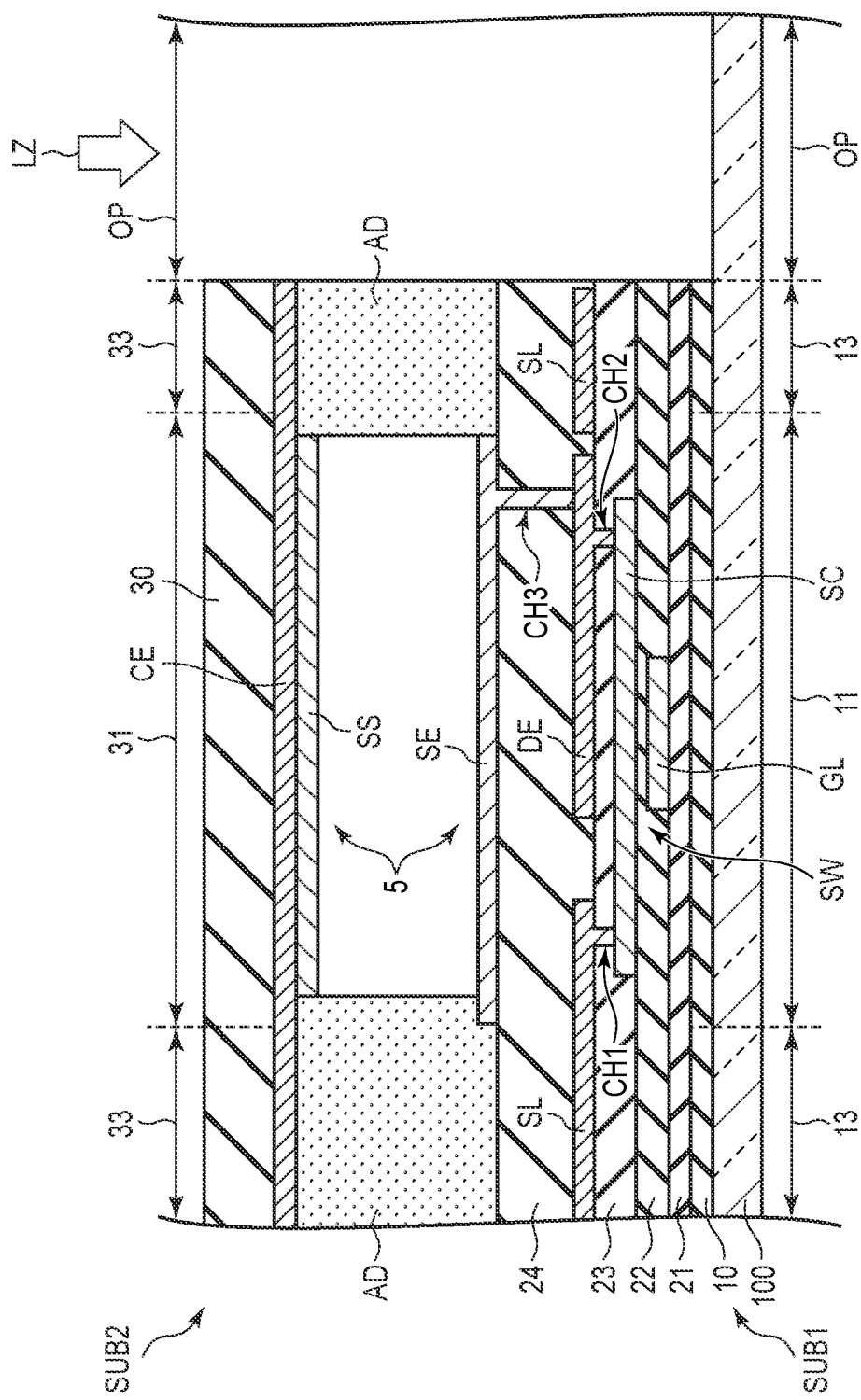
FIG. 8 is a cross-sectional view showing an example of the formation process of the electronic device shown in FIG. 4.

After a while, as shown in FIG. 8, a laser beam LZ is irradiated to the region where the opening OP is to be formed, and the opening OP is thus formed. In this manner, as shown in FIG. 2, the body portion 11 and wave-shaped hinge portions 12 and 13 are formed in the insulating base 10, thereby making the insulating base 10 into a mesh-like form. Further, as shown in FIG. 3, the body portion 31 and wave-shaped hinge portions 32 and 33 are formed in the insulating base 30, thereby making the insulating base 30 into a mesh-like form. Furthermore, as shown in FIG. 3, the common electrode CE as well can be made into a mesh-like form. Note that the laser beam LZ is irradiated to form the opening OP here, but the opening OP may as well be formed by irradiating plasma.

Finally, the glass substrate 100 is removed, and thus the sensor element 5 shown in FIG. 4 is formed.

In the following descriptions, the effects of the electronic device 1 of this embodiment will be explained using a comparative example. Note that the comparative example is intended to illustrate some of the effects that can be achieved by the electronic device 1 of this embodiment, and do not exclude the configuration and effects common to this embodiment and the comparative example from the scope of the present invention.

Figure 9:
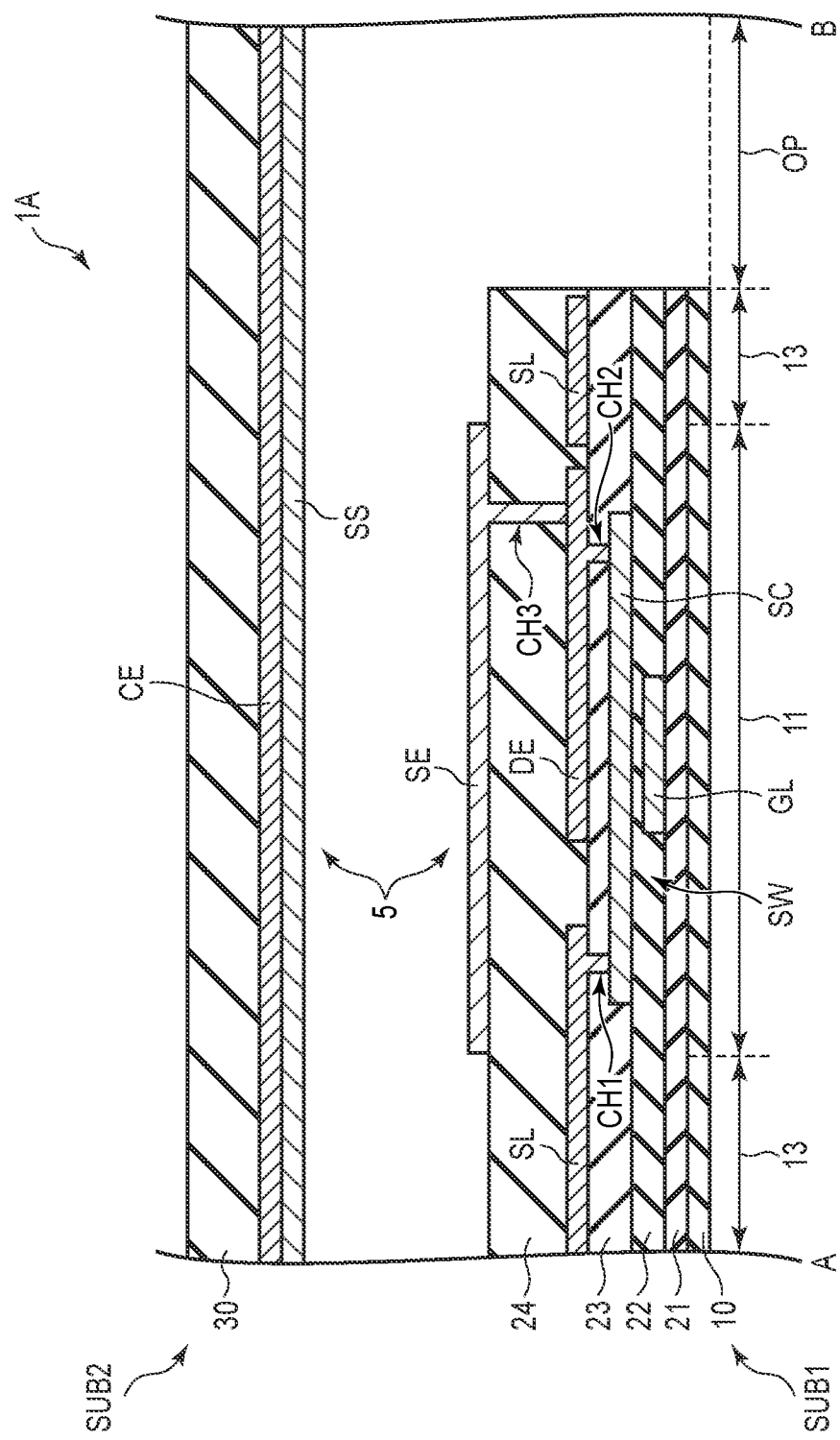
FIG. 9 is a cross-sectional view showing an example of a schematic configuration of an electronic device for a comparative example.
Figure 10:
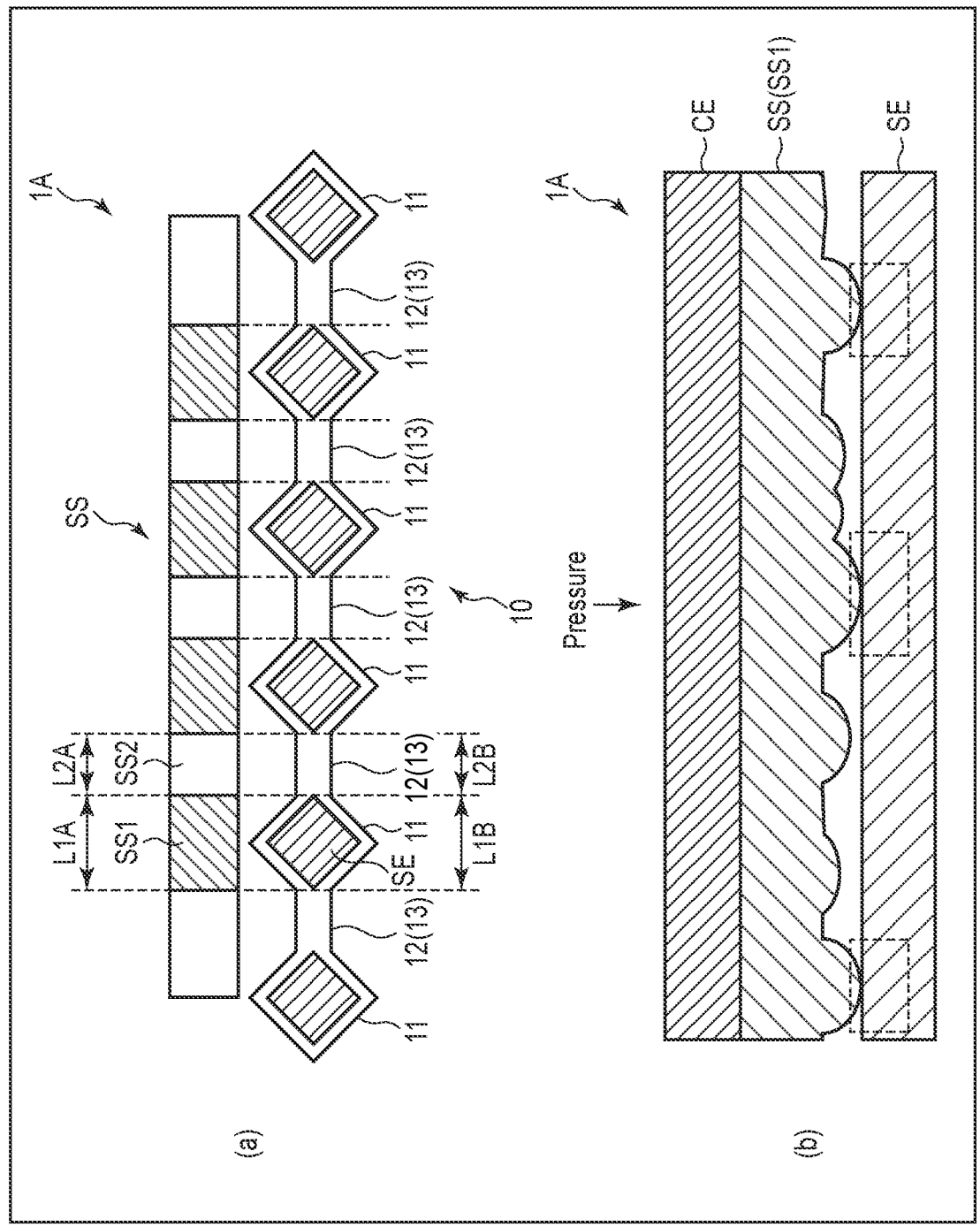
FIG. 10 is a diagram illustrating a case in which pressure is applied to an electronic device before expansion and contraction for a comparative example.
Figure 11:
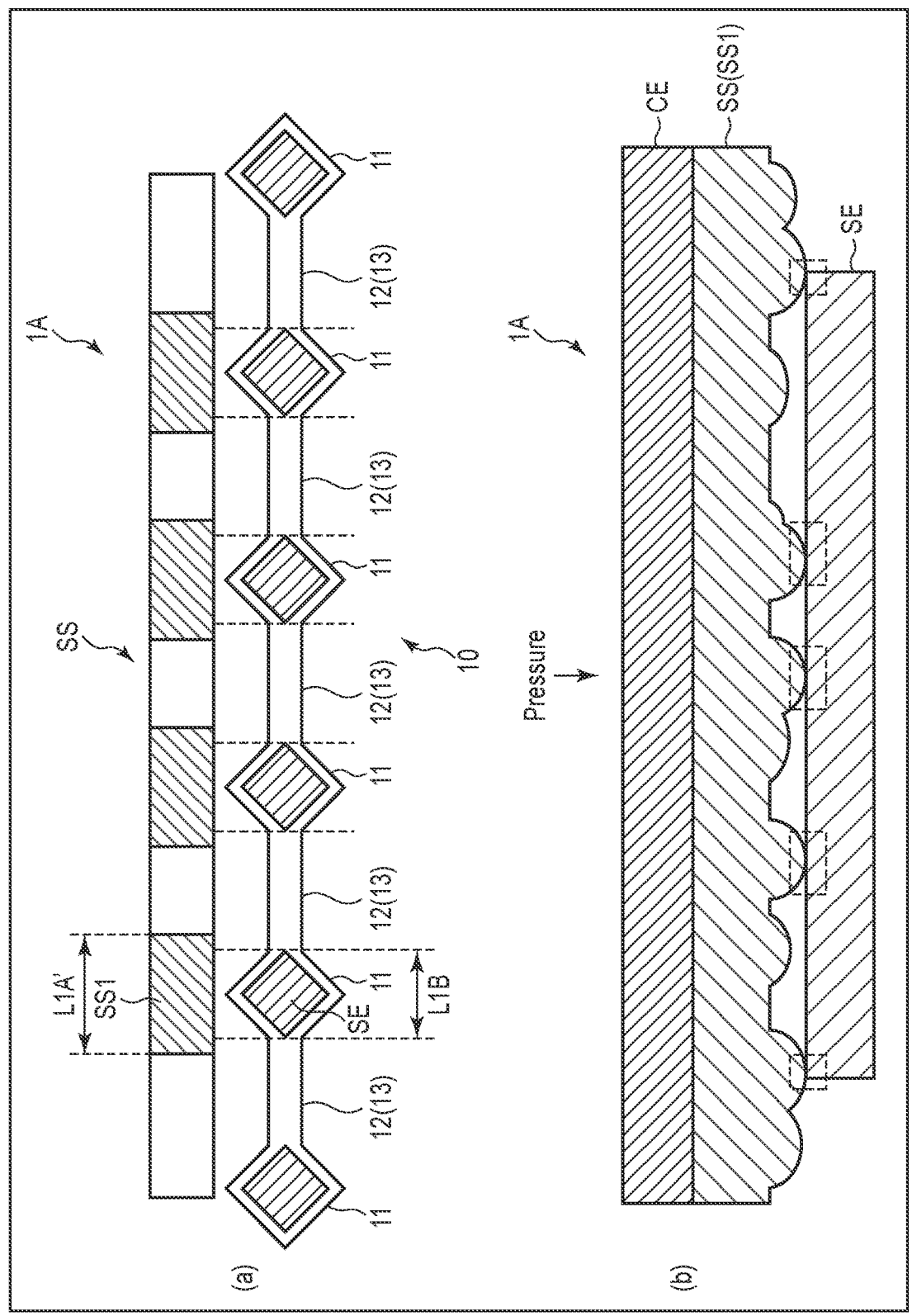
FIG. 11 illustrates a case where pressure is applied to the electronic device after expansion and contraction for a comparative example.

FIG. 9 is a cross-sectional view schematically showing a configuration example of the electronic device 1A according to a comparative example. FIG. 10 illustrates a case where pressure is applied to the electronic device 1A before expansion and contraction. FIG. 11 illustrates a case where pressure is applied to the electronic device 1A after expansion and contraction. As shown in FIG. 9, the electronic device 1A of the comparative example is different in configuration from the embodiment in that the elements on the second substrate SUB2 side are not made into a mesh-like form, the sensor sheet SS is arranged over a plurality of sensor elements 5, and the sensor sheet SS and the sensor electrode SE are not bonded together by the adhesive layer AD.

In the configuration shown in FIG. 9, as shown in (a) of FIG. 10, a length L1A of a first portion SS1 of the sensor sheet SS before expansion and contraction, and a length L1B of the body portion 11 before expansion and contraction are the same as each other. In addition, a length L2A of a second portion SS2 of the sensor sheet SS before expansion and contraction, and a length L2B of the hinge portion 13 (the hinge portion 12) before expansion and contraction are the same as each other. The surface of the sensor sheet SS has, as shown in (b) of FIG. 10, a shape in which a number of projections and recesses are arranged irregularly. When pressure of a predetermined magnitude is applied, the sensor sheet SS and the sensor electrode SE are brought into contact with each other in the portions enclosed by the dashed lines. The electronic device 1A detects a change in contact resistance corresponding to the contact area between the sensor sheet SS and the sensor electrode SE and measures the magnitude of pressure applied to the electronic device 1A.

During expansion and contraction, the sensor sheet SS expands and contracts uniformly, whereas the body portion 11 and the hinge portion 13 (the hinge portion 12) expand and contract only at the hinge portion 13 (hinge portion 12). With this configuration, in the configuration shown in FIG. 9, a length L1A' of the first portion SS1 of the sensor sheet SS after expansion and contraction becomes different from the length L1B of the body portion 11, as shown in (a) of FIG. 11. Therefore, the length L1A' of the first portion SS1 after expansion and contraction also differs from the length L1A of the first portion SS1 before expansion and contraction. According to this, even if a pressure of the same magnitude as that shown in (b) of FIG. 10 is applied to the electronic device 1A after expansion and contraction, the contact area between the sensor sheet SS and the sensor electrode SE is different from that of the case shown in (b) of FIG. 11. As a result, even though the same magnitude of pressure is applied before and after the expansion and contraction, different magnitudes of pressure are measured before and after the expansion and contraction, which may lead to lack of reliability.

By contrast, in the electronic device 1 of the embodiment, not only the elements on the first substrate SUB1 side but also those on the second substrate SUB2 side are made into a mesh-like form. With this configuration, during expansion and contraction, it is possible to expand and contract only the hinge portions 12 and 13 and 32 and 33 without expanding and contracting the body portions 11 and 31 in both the first and second substrates SUB1 and SUB2. In this manner, the length of the first portion SS1 of the sensor sheet SS does not change before and after expansion and contraction, and the contact area between the sensor sheet SS and the sensor electrode SE can be prevented from changing before and after expansion and contraction. Thus, it is possible to improve the reliability of pressure measurement.

In the electronic device 1 of the embodiment, since the sensor sheet SS and the sensor electrode SE are bonded together by the adhesive layer AD, it is possible to prevent the sensor sheet SS from being excessively stretched or misaligned even when pressure is applied. If the sensor sheet SS is misaligned, friction occurs between the sensor sheet SS and the sensor electrode SE, which may cause excessive wear of the sensor sheet SS. However, in the electronic device 1 of the embodiment, the above-described friction can be suppressed and therefore it is possible to prevent excessive wear of the sensor sheet SS.

Figure 12:
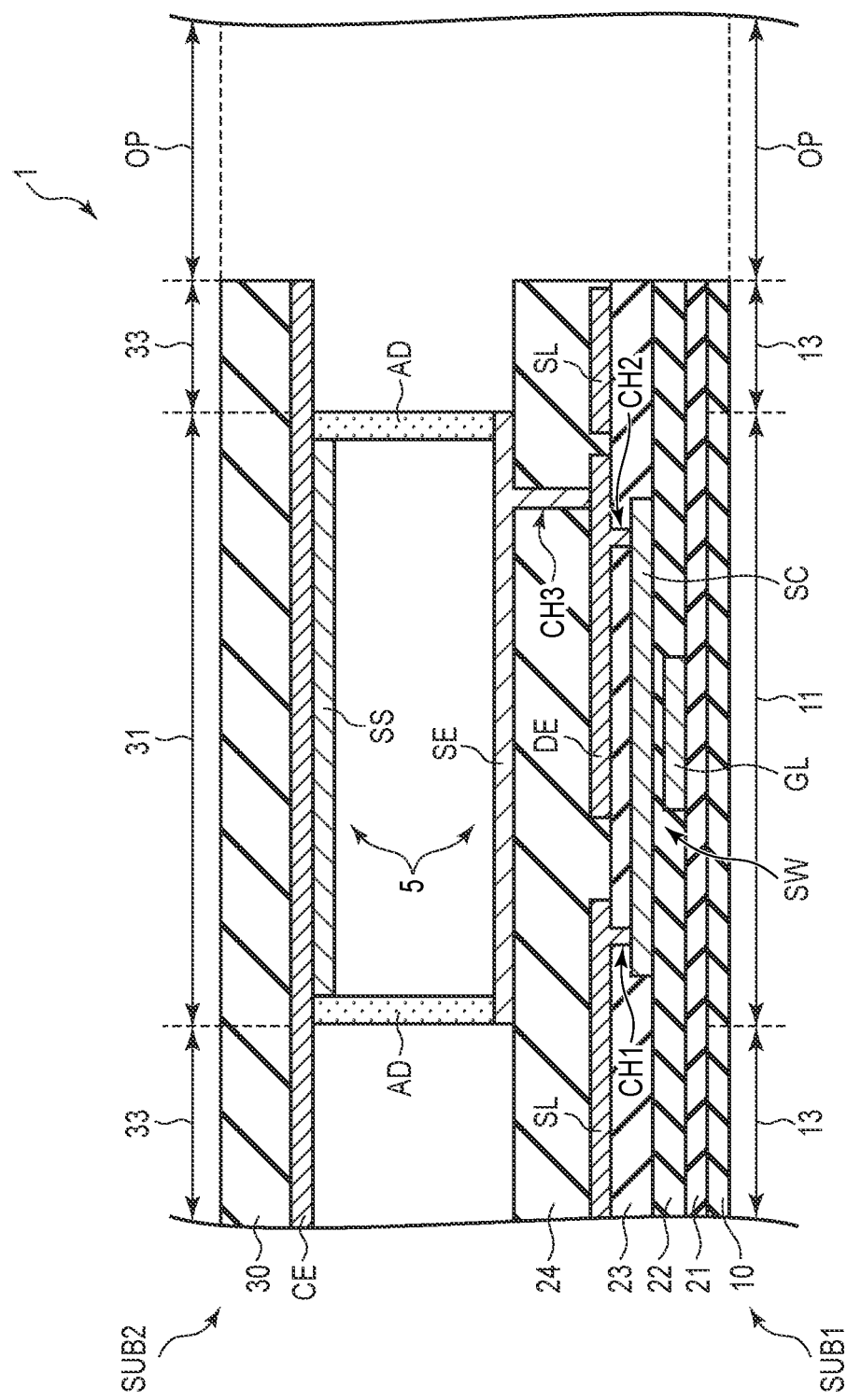
FIG. 12 is a cross-sectional view of an example configuration of an electronic device according to the first embodiment.

In the first embodiment described above, a configuration in which the adhesive layer AD is disposed in the position other than where the body portion 11 is formed, that is, a configuration in which the adhesive layer AD is disposed in the position where the hinge portions 12 and 13 are formed, is discussed as an example. But, the adhesive layer AD may not be disposed at the positions where the hinge portions 12 and 13 are formed. In this case, as shown in FIG. 12, the adhesive layer AD is disposed only at the position overlapping the outer circumference of the body portion 11 to bond end portions of the sensor electrode SE and end portions of the sensor sheet SS.

The rigidity of the portion overlapping the body portion 11 and the portions overlapping the hinge portions 12 and 13 is proportional to the cube of the film thickness. Therefore, according to this configuration, the rigidity of the portions overlapping the hinge portions 12 and 13 can be reduced and can be expanded and contracted with less force compared to the configuration in which the adhesive layer AD is disposed at the positions where it overlaps the hinge portions 12 and 13, as well.

Second Embodiment

Figure 13:
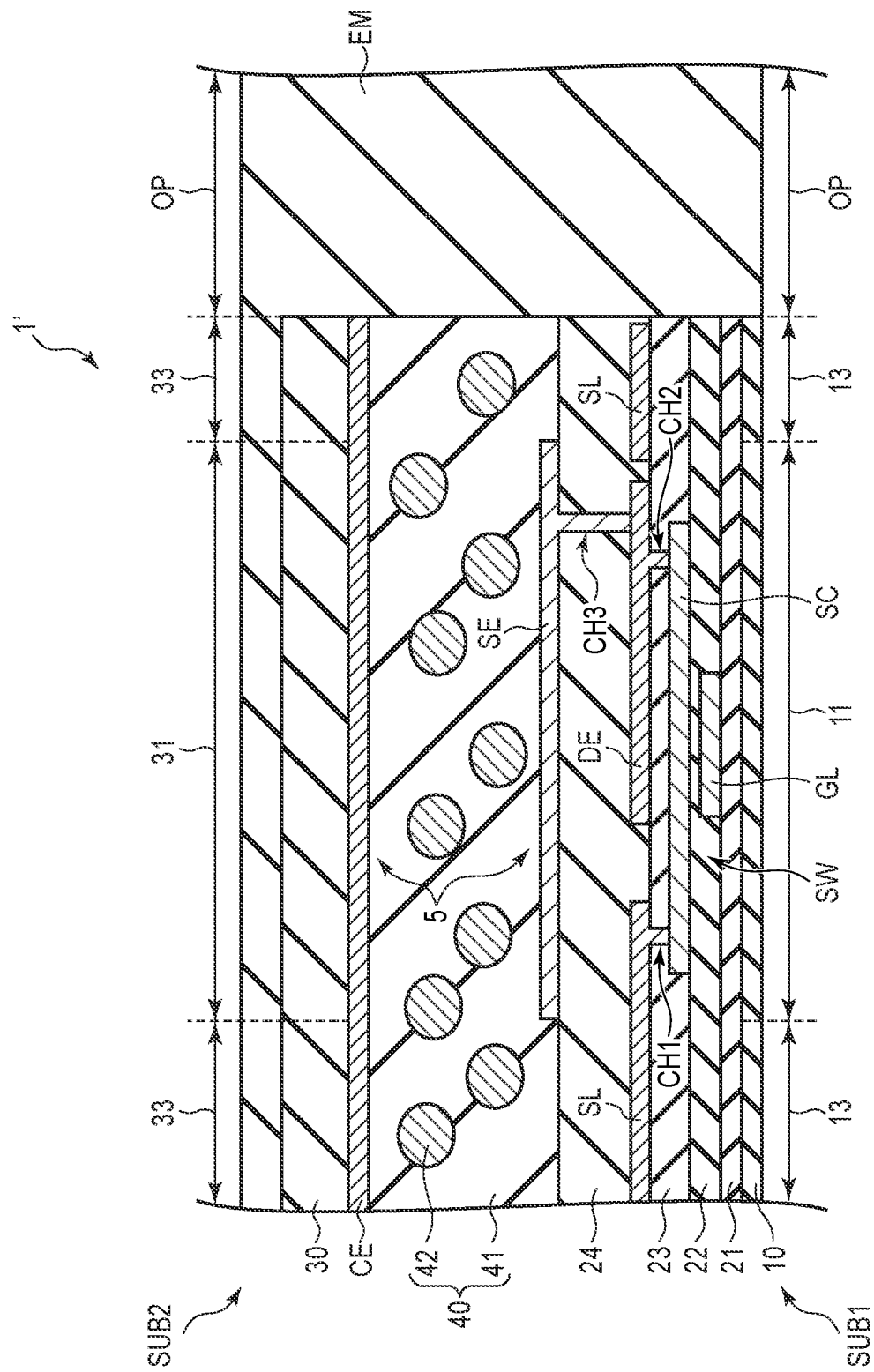
FIG. 13 is a cross-sectional view showing an example configuration of an electronic device according to the second embodiment.

Next, the second embodiment will be described. FIG. 13 is a cross-sectional view schematically showing a configuration example of an electronic device 1' according to the second embodiment. The electronic device 1' of the second embodiment is different from the electronic device 1 of the first embodiment in that the first substrate SUB1 and the second substrate SUB2 are covered by an elastic member EM, the adhesive layer AD is not provided, and a pressure sensitive layer 40 is provided in place of the sensor sheet SS. In the following descriptions, only the configuration different from that of the electronic device 1 according to the first embodiment will be described, and descriptions of similar configurations will be omitted.

As shown in FIG. 13, the first substrate SUB1 and the second substrate SUB2 are covered by the elastic member EM. With this configuration, the elements on the first substrate SUB1 side and the elements on the second substrate SUB2 side, which constitute the sensor element 5, can be fixed by the elastic member EM, and therefore the adhesive layer AD can be omitted. Therefore, the processing step of patterning the adhesive layer AD (the step shown in FIG. 6) can be omitted.

Note that as to the electronic device 1' according to the second embodiment, such a configuration that a pressure sensitive layer 40 that does not require to provide a space between the first substrate SUB1 and the second substrate SUB2 should preferably be adopted in order to prevent the above-mentioned elastic member EM from entering between the first substrate SUB1 and the second substrate SUB2.

As shown in FIG. 13, the pressure-sensitive layer 40 is arranged over the insulating layer 24 so as to cover the sensor electrodes SE. The pressure-sensitive layer 40 is disposed in positions overlapping the body portion 11 and the hinge portions 13 (and the hinge portions 12, which are not shown in FIG. 13), but not in the opening OP. In other words, the pressure-sensitive layer 40 as well is formed in a mesh-like form with openings OP. The pressure-sensitive layer 40 contains an insulator 41 and conductive particles 42. When pressure is applied from the second substrate SUB2 side, the conductive particles 42 contained in the pressure-sensitive layer 40 are brought into contact with the sensor electrodes SE and the common electrode CE. The electronic device 1' detects the change in contact resistance caused by the conductive particles 42 brought into contact with the sensor electrodes SE and the common electrode CE, and measures the magnitude of the pressure applied to the electronic device 1'.

In the electronic device 1' according to the second embodiment described above, the elements on the first substrate SUB1 side (the insulating base 10) and the elements on the second substrate SUB2 side (the insulating base 30, common electrode CE, pressure-sensitive layer 40) are formed in a mesh-like form, similarly with respect to the configuration of the first embodiment described above, it is possible to improve the reliability of pressure measurement.

Moreover, in the electronic device 1' of the second embodiment, since the first substrate SUB1 and the second substrate SUB2 are fixed by the elastic member EM, it is possible to suppress misalignment between the elements which constitute the sensor element 5 even when pressure is applied.

Each of the embodiments described above has been described in connection with the case where the hinge portions 12 and 13 of the insulating base 10, the scanning lines GL, the signal lines SL, the hinge portions 32 and 33 of the insulating base 30, and the common electrode CE are all formed into the wavy shape, but they may be formed into a zigzag-line form or in a curved line shape in which a plurality of curvy shapes of different curvatures are combined.

Further, in each of the embodiments described above, the common electrode CE is formed of an organic conductive material and the common electrode CE is patterned by the laser beam LZ in the process of forming the openings OP, but the common electrode CE may be formed of a metal material. In this case, since the common electrode CE formed of a metal material cannot be patterned by the laser beam LZ, it is necessary to pattern the common electrode CE in a separate method so that the common electrode CE is not placed at positions where the openings OP are formed. But, by forming the common electrode CE from a metal material, the wiring resistance can be reduced compared to the case where the common electrode CE is formed of an organic conductive material.

The common electrode CE formed into the wavy shape has a wiring resistance higher than that of the case where the common electrode CE is formed into a straight line, and entails such a drawback that it is very susceptible to voltage drop. As a result, a large difference may be created between the voltage applied to the vicinity of the outer circumference of the active area AA and the voltage applied to the vicinity of the central portion of the active area AA. However, by forming the common electrode CE from a metal material, the above-described wiring resistance can be reduced, and the effect of the voltage drop can be suppressed. In this manner, it is possible to reduce the difference between the voltage applied to the vicinity of the outer circumference of the active area AA and the voltage applied to the vicinity of the central portion of the active area AA.

Figure 14:
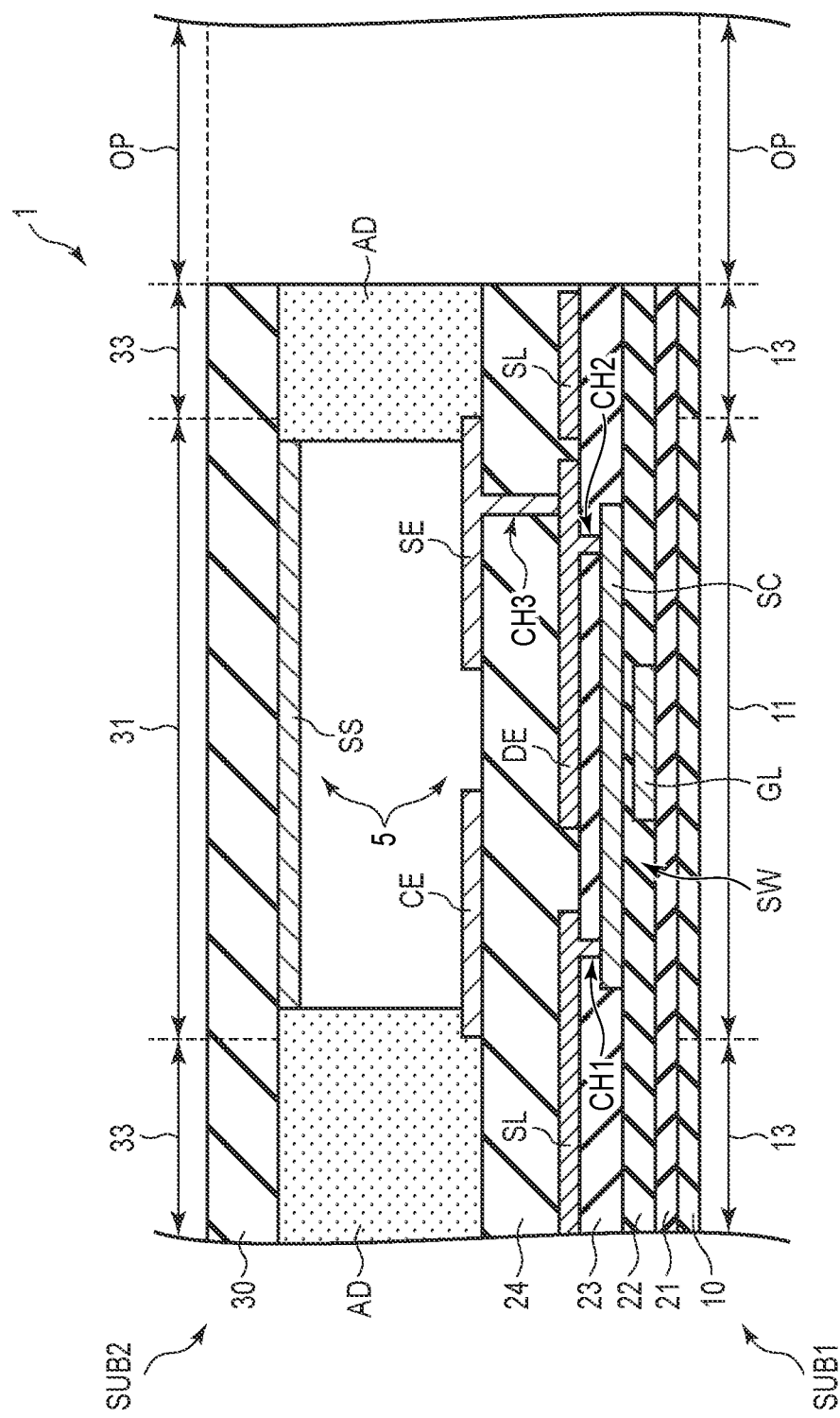
FIG. 14 is a cross-sectional view showing an example configuration of an electronic device for each embodiment.

Furthermore, in each of the embodiments described above, the common electrode CE are arranged on the second substrate SUB2 side, but as shown in FIG. 14, for example, the common electrode CE may be arranged on the first substrate SUB1 side. In this case, the common electrode CE is disposed in the same layer as that of the sensor electrode SE. Further, here, the common electrode CE is disposed only at the position overlapping the respective body portion 11 and not at the position overlapping the respective hinge portion 13 (and the respective hinge portion 12 not shown in FIG. 14) or in the respective opening OP. Therefore, it is not necessary to consider patterning by laser beam LZ as described above, and it is possible to form the common electrode CE from a metal material.

According to at least one of the embodiments described above, it is possible to provide an electronic device with an improved reliability of sensing by a sensor element mounted on a substrate having elasticity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a first substrate; and a second substrate opposing the first substrate,
the first substrate comprising:
- a first insulating base including a plurality of first island-shaped portions and a plurality of first band portions each connecting a respective pair of first island-shaped portions adjacent to each other, and made into a mesh-like form,
- a wiring layer disposed over the first band portion, and
- a sensor electrode disposed over the first island-shaped portion and electrically connected to the wiring layer, and the second substrate comprising:
- a second insulating base including a plurality of second island-shaped portions and a plurality of second band portions connecting a respective pair of second island-shaped portions adjacent to each other, and made into a mesh-like form,
- a common electrode disposed below the second island-shaped portion and the second band portion, and made into a mesh-like form, and
- a sensor sheet overlapping the second island-shaped portion in plan view and disposed below the common electrode.

2. The electronic device of claim 1, wherein
the sensor electrode and the sensor sheet oppose each other, and
a space is provided between the sensor electrode and the sensor sheet.

3. The electronic device of claim 1, wherein
the first island-shaped portion and the second island-shaped portion overlap each other in plan view, and
the first band portion and the second band portion overlap each other in plan view.

4. The electronic device of claim 1, further comprising an adhesive layer disposed in a position overlapping the first band portion and the second band portion in plan view, to bond the sensor electrode and the sensor sheet together.

5. The electronic device of claim 1, further comprising an adhesive layer disposed in a position overlapping an outer circumference of each of the first island-shaped portions and the second island-shaped portions in plan view, to bond the sensor electrode and the sensor sheet together.

6. The electronic device of claim 1, wherein the common electrode is formed of an organic conductive material.

7. The electronic device of claim 1, wherein the common electrode is formed of a metal material.

8. An electronic device comprising:
a first substrate;
a second substrate opposing the first substrate; and
an elastic member sealing the first substrate and the second substrate,
the first substrate comprising:
- a first insulating base including a plurality of first island-shaped portions and a plurality of first band portions each connecting a respective pair of first island-shaped portions adjacent to each other, and made into a mesh-like form,
- a wiring layer disposed over the first band portion, and
- a sensor electrode disposed over the first island-shaped portion and electrically connected to the wiring layer, and the second substrate comprising:
- a second insulating base including a plurality of second island-shaped portions and a plurality of second band portions connecting a respective pair of second island-shaped portions adjacent to each other and made into a mesh-like form,
- a common electrode disposed below the second island-shaped portion and the second band portion and made into a mesh-like form, and
- a pressure-sensitive layer overlapping the second island-shaped portion and the second band portion in plan view, disposed below the common electrode, and made into a mesh-like form.

9. The electronic device of claim 8, wherein the pressure-sensitive layer is disposed between the sensor electrode and the common electrode.

10. The electronic device of claim 8, wherein
the first island-shaped portion and the second island-shaped portion overlap each other in plan view, and
the first band portion and the second band portion respectively overlap each other in plan view.

11. The electronic device of claim 8, wherein the common electrode is formed of an organic conductive material.

12. The electronic device of claim 8, wherein the common electrode is formed of a metal material.

* * * * *